[12] United States Patent  
Li et al.

(10) Patent No.: US 10,269,648 B1  
(45) Date of Patent: Apr. 23, 2019

(54) METHOD OF FABRICATING A SEMICONDUCTOR DEVICE STRUCTURE

(71) Applicant: Taiwan Semiconductor Manufacturing Co., Ltd., Hsinchu (TW)

(72) Inventors: Kun-Mu Li, Zhudong Township, Hsinchu County (TW); Chih-Chiang Chang, Zhubei (TW); Wen-Chu Hsiao, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/857,381

(22) Filed: Dec. 28, 2017

Related U.S. Application Data

(60) Provisional application No. 62/587,556, filed on Nov. 17, 2017.

(51) Int. Cl.  
*H01L 21/8234* (2006.01)  
*H01L 29/78* (2006.01)  
*H01L 29/66* (2006.01)  
*H01L 29/417* (2006.01)

(52) U.S. Cl.  
CPC ........... *H01L 21/823431* (2013.01); *H01L 29/41791* (2013.01); *H01L 29/66795* (2013.01); *H01L 29/785* (2013.01)

(58) Field of Classification Search  
CPC ............................................. H01L 21/823431  
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,805,989 B1 * | 10/2017 | Adusumilli ..... H01L 21/823814 |

(Continued)

*Primary Examiner* — Errol V Fernandes  
(74) *Attorney, Agent, or Firm* — Birch, Stewart, Kolasch & Birch, LLP

(57) ABSTRACT

Methods of fabricating a semiconductor device structure are provided. The method includes forming a fin structure over a substrate. The method also includes forming a gate structure over the fin structure. The method further includes epitaxially growing a source/drain structure covering the fin structure. In addition, the method includes epitaxially growing a capping layer over the source/drain structure. The capping layer has a top portion and a lower portion under the top portion. The top portion has a first thickness and the lower portion has a second. A ratio of the first thickness to the second thickness is in a range of about 1.01 to about 2. The method also includes etching the top portion and the lower portion of the capping layer. The method further includes forming a silicide layer over the source/drain structure and a contact over the silicide layer.

20 Claims, 12 Drawing Sheets

(56) References Cited

U.S. PATENT DOCUMENTS

| | | | |
|---|---|---|---|
| 2007/0128819 A1* | 6/2007 | Miyanami | H01L 21/02381 |
| | | | 438/357 |
| 2017/0170315 A1* | 6/2017 | Ok | H01L 29/7845 |
| 2018/0190810 A1* | 7/2018 | Li | H01L 29/785 |

* cited by examiner

METHOD OF FABRICATING A SEMICONDUCTOR DEVICE STRUCTURE

PRIORITY CLAIM AND CROSS-REFERENCE

This application claims the benefit of U.S. Provisional Application No. 62/587,556, entitled "METHOD OF FABRICATING A SEMICONDUCTOR DEVICE STRUCTURE" filed on Nov. 17, 2017, the entirety of which is incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with fin field-effect transistors (FinFETs), has been introduced to replace planar transistors. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
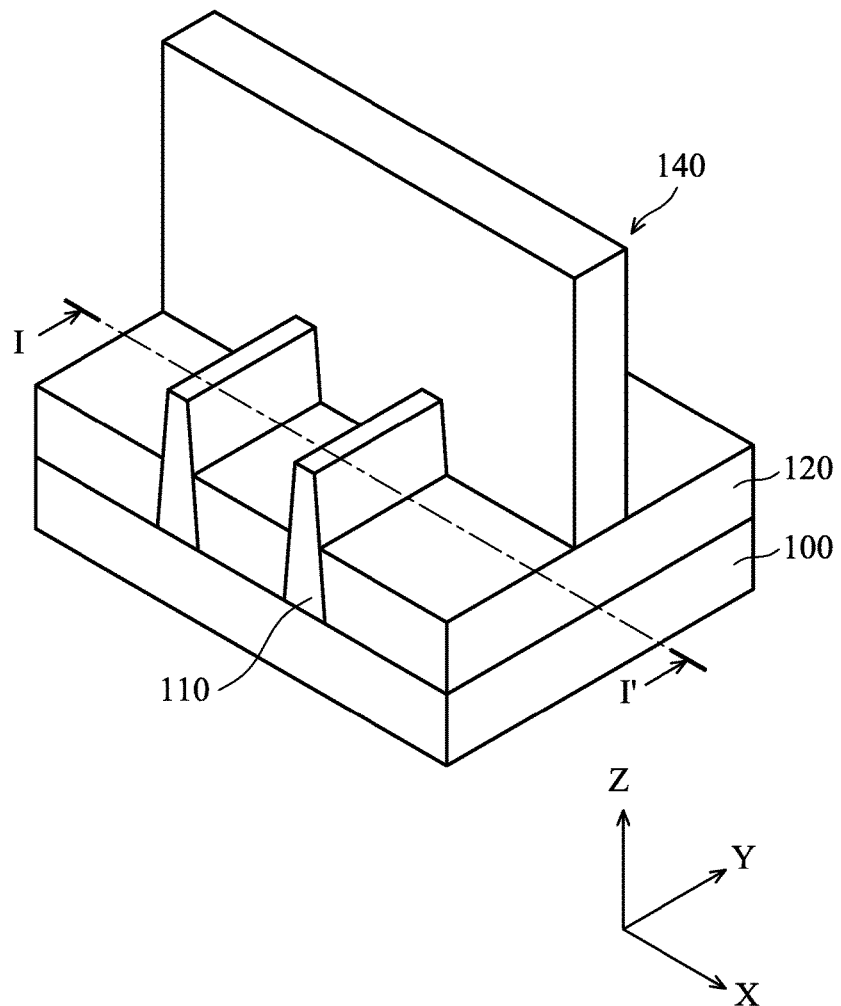
FIG. 1 is a perspective view of one stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure. Some embodiments of the disclosure are described. FIG. 1 is a perspective view of one stage of a process for forming a semiconductor device structure, in accordance with some embodiments. For a better understanding of the semiconductor device structure, an X-Y-Z coordinate reference is provided in FIG. 1. The X-axis is generally orientated along a substrate surface of a semiconductor device structure in the lateral direction. The Y-axis is generally oriented along the substrate surface perpendicular to the X-axis. The Z-axis is generally oriented along direction perpendicular to the X-Y plane.

FIGS. 2A-2J are cross-sectional views of various stages of a process for forming a semiconductor device structure, in accordance with some embodiments. In some embodiments, FIGS. 2A-2J are cross-sectional views taken along line I-I' shown in FIG. 1. Line I-I' may be substantially parallel to the X-axis. More specifically, FIGS. 2A-2J illustrate the cross-sectional views of fin structures, source/drain structure and capping layer which are discussed in more detail below.

Additional operations can be provided before, during, and/or after the stages described in FIG. 1 and FIGS. 2A-2J. Some of the stages that are described can be replaced or eliminated for different embodiments. Additional features can be added to the semiconductor device structure. Some of the features described below can be replaced or eliminated for different embodiments.

Figure 2A:
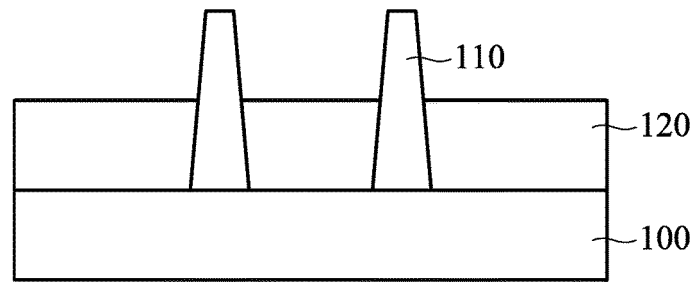
FIGS. 2A-2J are cross-sectional views of various stages of a process for forming a semiconductor device structure, in accordance with some embodiments.

As shown in FIGS. 1 and 2A, a semiconductor substrate 100 is provided. The surface of the semiconductor substrate 100 is substantially parallel to the X-Y plane. In some embodiments, the semiconductor substrate 100 is a bulk semiconductor substrate, such as a semiconductor wafer. In some embodiments, the semiconductor substrate 100 includes silicon or another elementary semiconductor material such as germanium. For example, the semiconductor substrate 100 is a silicon wafer.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1 and FIG. 2A, multiple fin structures 110 are over the semiconductor substrate 100, in accordance with some embodiments. The fin structures 110 extend along the Y-axis and are arranged in a direction that is substantially parallel to the X-axis, as shown in FIGS. 1 and 2A.

The fin structures 110 may be patterned by any suitable method. For example, the fin structures 110 may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 110.

As shown in FIGS. 1 and 2A, isolation features 120 are formed in the recesses of the semiconductor substrate 100 to surround lower portions of the fin structures 110, in accordance with some embodiments. The isolation features 120 are used to define and electrically isolate various device elements formed in and/or over the semiconductor substrate 100. In some embodiments, the isolation features 120 include shallow trench isolation (STI) features, local oxidation of silicon (LOCOS) features, other suitable isolation features, or a combination thereof.

In some embodiments, the isolation features 120 are made of a dielectric material. The dielectric material may include silicon oxide, silicon nitride, silicon oxynitride (SiON), spin-on glass, low-K dielectric material, another suitable material, or a combination thereof. In some embodiments, each of the isolation features 120 has a multi-layer structure.

In some embodiments, a dielectric material layer is deposited over the semiconductor substrate 100. The dielectric material layer covers the fin structures 110 and fills the recesses between the fin structures 110. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 110 are exposed. The planarization process may include a chemical mechanical polishing (CMP) process, a grinding process, an etching process, another applicable process, or a combination thereof. Afterwards, the dielectric material layer is etched back to form the isolation features 120. The fin structures 110 protrude from the isolation features 120, as shown in FIGS. 1 and 2A, in accordance with some embodiments.

As shown in FIG. 1, a gate structure 140 is formed over the semiconductor substrate 100, in accordance with some embodiments. The gate structure 140 partially covers multiple fin structures 110 and multiple isolation features 120. In some embodiments, the gate structure 140 extends along the X-axis as shown in FIG. 1. The gate structure 140 may be a dummy or sacrificial gate structure, which will be removed in a subsequent process.

In some embodiments, the gate structure 140 includes a gate dielectric layer (not shown) and a gate electrode (not shown). The gate dielectric layer extends over the fin structures 110 and the isolation features 120. In some embodiments, the gate dielectric layer is a sacrificial or dummy gate dielectric layer and will be replaced with another gate dielectric layer. In some embodiments, the gate dielectric layer is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, and combinations thereof.

The gate electrode is formed over the gate dielectric layer. In some embodiments, the gate electrode includes a polysilicon, a metal material, another suitable conductive material, or a combination thereof. In some embodiments, the gate electrode is a sacrificial or dummy gate electrode layer and will be replaced with another conductive material such as a metal material. The sacrificial gate electrode layer is made of a sacrificial material, for example, polysilicon.

In some embodiments, the gate structure 140 includes a hard mask (not shown) which is formed over the gate electrode. The hard mask may be used to assist in the patterning process for forming the gate dielectric layer and the gate electrode. In some embodiments, the hard mask includes silicon oxide, silicon nitride, silicon oxynitride, silicon carbide, another suitable material, or a combination thereof. In some embodiments, the hard mask has a multi-layer structure.

For example, in some embodiments, a gate dielectric material layer and a gate electrode layer are sequentially deposited by using suitable deposition methods. The suitable deposition methods may a CVD process, an atomic layer deposition (ALD) process, a thermal oxidation process, a physical vapor deposition (PVD) process, another applicable process, or a combination thereof. Afterwards, a photolithography process and an etching process are performed to pattern the hard mask layer. With the assistance of the patterned hard mask, the gate dielectric material layer and the gate electrode layer are etched and patterned. As a result, the gate dielectric layer and the gate electrode are formed.

Figure 2B:
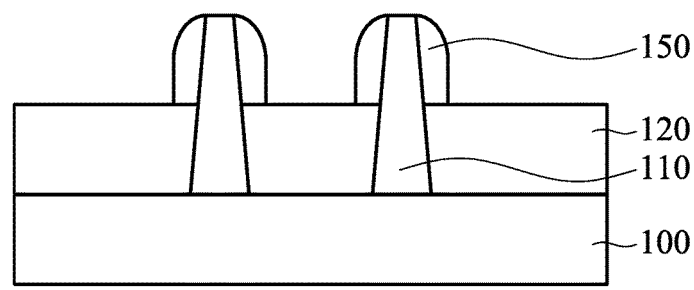

As shown in FIG. 2B, fin spacers 150 are formed over sidewalls of the fin structures 110, in accordance with some embodiments. The fin spacers 150 are used to define the profile of subsequently formed source/drain structure. The fin spacers 150 may contain a group-IV element, a group-V element, and/or a group-VI element. In some embodiments, the fin spacers 150 are made of silicon nitride, silicon oxynitride, silicon carbide, silicon oxycarbide, another suitable material, or a combination thereof. Many variations and/or modifications can be made to embodiments of the disclosure. In some other embodiments, the fin spacers 150 are not formed.

In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the fin structures 110 form the fin spacers 150. In some embodiments, other remaining portions of the spacer layer over the sidewalls of the gate structure 140 form the gate spacers (not shown).

Figure 2C:
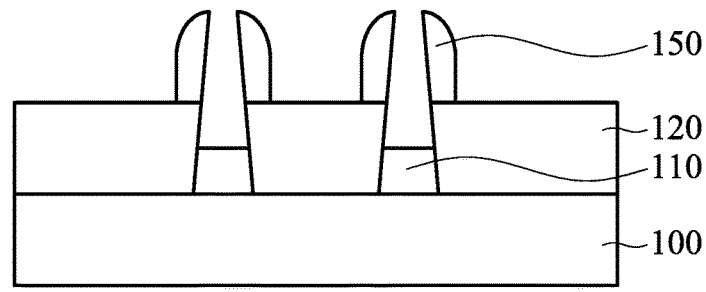

As shown in FIG. 2C, a portion of the fin structures 110 are etched to form recesses, in accordance with some embodiments. In some embodiments, one or more etching processes are performed to recess and remove the upper portions of the fin structures 110 so that the top surfaces of the fin structures 110 are lower than those of the isolation features 120. The etching processes may be a dry etching process, another applicable process, or a combination thereof. Moreover, the recesses are surrounded by the fin spacers 150 and the isolation features 120, and over the remaining fin structures 110.

Figure 2D:
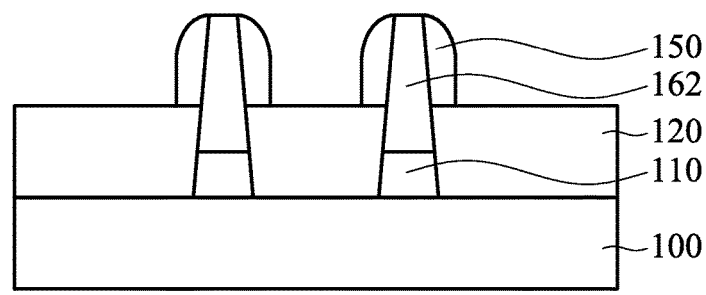

As shown in FIG. 2D, a first epitaxial layer 162 is epitaxially grown in the recesses, in accordance with some embodiments. As shown in FIG. 2D, the first epitaxial layer 162 is epitaxially grown between the fin spacers 150 and over the fin structures 110. In some embodiments, the first epitaxial layer 162 has a bar-like shape, as shown in FIG. 2D. In some embodiments, the first epitaxial layer 162 is a P-type semiconductor material. For example, the first epitaxial layer 162 may include epitaxially grown silicon germanium (SiGe). The first epitaxial layer 162 is not limited to being a P-type semiconductor material. In some embodiments, the first epitaxial layer 162 is an N-type semiconductor material. For example, the first epitaxial layer 162 may include epitaxially grown silicon, silicon-germanium (SiGe), boron-doped silicon germanium (SiGeB) or another suitable epitaxially grown semiconductor material.

In some embodiments, the first epitaxial layer 162 is formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof.

The formation process of the first epitaxial layer 162 may use gaseous and/or liquid precursors. In some embodiments, during the formation of the first epitaxial layer 162, a germanium (Ge)-containing precursor is introduced or supplied into a reaction chamber (not shown) so that the first epitaxial layer 162 has a first atomic percentage of Ge. In some embodiments, the first atomic percentage of Ge is in a range of about 10% to about 40%. In some embodiments, during the formation of the first epitaxial layer 162, a boron (B)-containing precursor is introduced or supplied into the reaction chamber so that the first epitaxial layer 162 has a first dopant concentration of B. In some embodiments, the first dopant concentration of B is in a range of about $5 \times 10^{19}/cm^3$ to about $1 \times 10^{21}/cm^3$. In some embodiments, the temperature in the reaction chamber is in a range of about 600° C. to about 900° C. In some embodiments, the pressure in the reaction chamber is in a range of about 10 torr to about 200 torr.

Figure 2E:
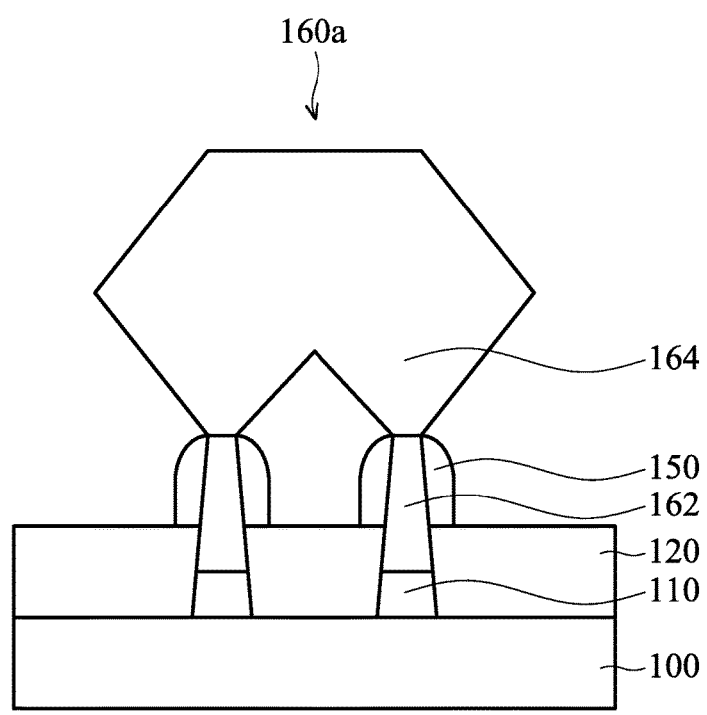

As shown in FIG. 2E, a second epitaxial layer 164 is epitaxially grown over the first epitaxial layer 162 after the formation of the first epitaxial layer 162, in accordance with some embodiments. In some embodiments, the second epitaxial layer 164 is a diamond shaped in the cross-section plane along the X-axis.

In some embodiments, the second epitaxial layer 164 is a P-type semiconductor material. For example, the second epitaxial layer 164 may include epitaxially grown silicon germanium (SiGe). In some embodiments, the second epitaxial layer 164 is an N-type semiconductor material. For example, the second epitaxial layer 164 may include epitaxially grown silicon, silicon-germanium (SiGe), boron-doped silicon germanium (SiGeB) or another suitable epitaxially grown semiconductor material.

The process for forming the second epitaxial layer 164 may be the same as or similar to that of the first epitaxial layer 162, and is not repeated herein. In some embodiments, during the formation of the second epitaxial layer 164, a Ge-containing precursor is introduced or supplied into a reaction chamber so that the second epitaxial layer 164 has a second atomic percentage of Ge which is greater than the first atomic percentage of Ge. In some embodiments, the second atomic percentage of Ge is in a range of about 20% to about 80%. In some embodiments, during the formation of the second epitaxial layer 164, a B-containing precursor is introduced or supplied into the reaction chamber so that the second epitaxial layer 164 has a second dopant concentration of B which is greater than that the first dopant concentration of B. In some embodiments, the second dopant concentration of B is in a range of about $1 \times 10^{20}/cm^3$ to about $3 \times 10^{21}/cm^3$.

As shown in FIG. 2E, the first epitaxial layer 162 and the second epitaxial layer 164 can be used as a first portion and a second portion of a source/drain (S/D) structure 160a, respectively. In some embodiments, the S/D structure 160a is multi-layers and each layer has different ratio of components from each other. In some embodiments, the S/D structure 160a has a gradient atomic percentage of Ge. In some embodiments, the S/D structure 160a has a greater atomic percentage of Ge in an outer layer and a smaller atomic percentage of Ge in an inner layer. In some embodiments, the S/D structure 160a has a gradient dopant concentration of B. In some embodiments, the S/D structure 160a has a greater dopant concentration of B in an outer layer and a smaller dopant concentration of B in an inner layer.

In some embodiments, the first epitaxial layer 162 and the second epitaxial layer 164 are doped with more dopants. For example, the first epitaxial layer 162 and the second epitaxial layer 164 are doped with phosphorus (P), arsenic (As), gallium (Ga), indium (In) or other suitable elements. In some embodiments, multiple implantation processes are performed to dope the S/D structure 160a.

In some embodiments, the S/D structure 160a is doped in-situ during the growth of the S/D structure 160a. For example, the first epitaxial layer 162 and the second epitaxial layer 164 are doped in the same reaction chamber. In some embodiments, the first epitaxial layer 162 and the second epitaxial layer 164 are doped in different reaction chambers. In some other embodiments, the S/D structure 160a is not doped during the growth of the S/D structure 160a. For example, after the epitaxial growth, the S/D structure 160a is doped in a subsequent process. In some embodiments, the doping is achieved using an ion implantation process, a plasma immersion ion implantation process, a gas and/or solid source diffusion process, another applicable process, or a combination thereof. In some embodiments, the S/D structure 160a is further exposed to annealing processes to activate the dopants. For example, a rapid thermal annealing process is performed.

Figure 2F:
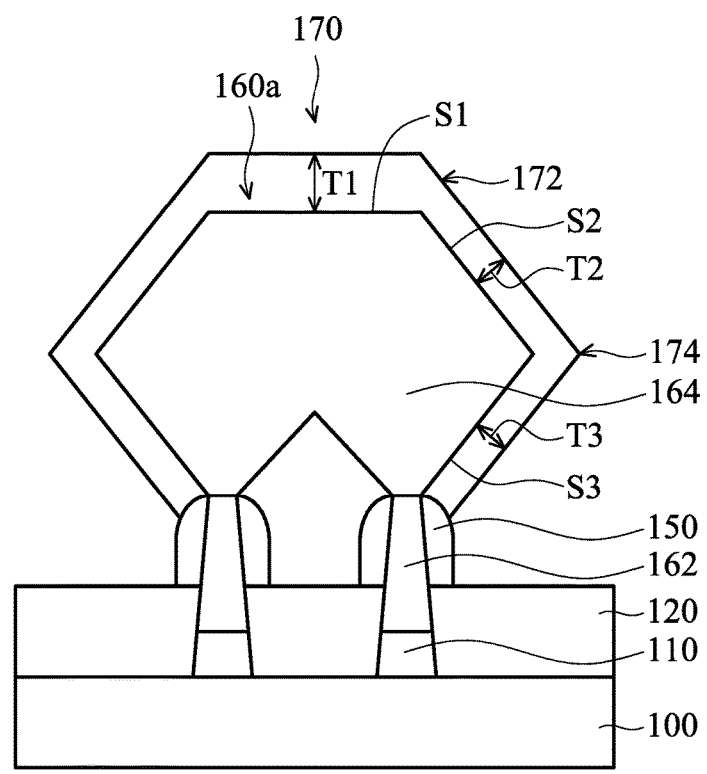

As shown in FIG. 2F, a capping layer 170 is epitaxially grown over the S/D structure 160a, in accordance with some embodiments. The capping layer may be used as a buffer layer in a subsequently etching process to control the etching amount of the S/D structure 160a. As shown in FIG. 2F, the capping layer 170 covers the second epitaxial layer 164. In some embodiments, the capping layer 170 is not in direct contact with the first epitaxial layer 162. In some embodiments, the capping layer 170 is made of Ge-containing material which includes SiGe, SiGeB, SiGeC:B, SiGeGa, SiGeBGa or another suitable epitaxially grown semiconductor material.

In some embodiments, the S/D structure 160a has a first surface S1, a second surface S2 and a third surface S3, as shown in FIG. 2F. The first surface S1 is a top surface of the S/D structure 160a. The second surface S2 and the third surface S3 are side surfaces of the S/D structure 160a, and the second surface S2 is between the first surface S1 and the third surface S3. Moreover, the first surface S1 is also referred to as (100) surface, and the second surface S2 is also referred to as (111) surface.

In some embodiments, the capping layer 170 has a first thickness T1 over the first surface S1, a second thickness T2 over the second surface S2 and a third thickness T3 over the third surface S3, as shown in FIG. 2F. In some embodiments, the capping layer 170 is made of Ge-containing material, and the growth rate of the capping layer 170 on the (100) surface is greater than the growth rate on the (111) surface.

Therefore, the first thickness T1 is greater than the second thickness T2 and the third thickness T3, and the second thickness T2 is substantially equivalent to the third thickness T3. In some embodiments, the first thickness T1 is in a range of about 1 nm to about 10 nm, and the second thickness T2 is in a range of about 0.5 nm to about 9.5 nm.

More specifically, the capping layer 170 has a top portion 172 over the first surface S1, and a lower portion 174 over the second surface S2 and the third surface S3. In some embodiments, the capping layer 170 has a thickness of the top portion 172 (e.g. the first thickness T1) which is greater than a thickness of the lower portion 174 (e.g. the second thickness T2 and the third thickness T3).

In some embodiments, the ratio of the first thickness T1 to the second thickness T2 is in a range of about 1.01 to about 2. In some embodiments, the ratio of the first thickness T1 to the second thickness T2 is in a range of about 1.1 to about 1.5. In some cases, the ratio of the first thickness T1 to the second thickness T2 should not be greater than about 2. If the ratio of the first thickness T1 to the second thickness T2 is greater than 2, the loss of the S/D structure 160a on the second surface S2 may be much greater than that on the first surface S1 in the subsequent etching process, and the difference of the loss of the S/D structure 160a on the first surface S1 and on the second surface S2 may be increased. As a result, the total loss of the S/D structure 160a is increased due to large difference of the loss of the S/D structure 160a on the first surface S1 and on the second surface S2, and the performance of the semiconductor device structure is decreased.

In some embodiments, during the epitaxial growth of the capping layer 170, a Ge-containing precursor is introduced or supplied into a reaction chamber so that the capping layer 170 has a third atomic percentage of Ge. In some embodiments, the third atomic percentage of Ge is smaller than the first atomic percentage of Ge and the second atomic percentage of Ge. In some embodiments, the third atomic percentage of Ge is in a range of about 1% to about 35%.

In some cases, the third atomic percentage of Ge should not be greater than 35%. If the third atomic percentage of Ge is greater than 35%, the growth rate of the capping layer 170 on the (100) surface may be faster than the growth rate on the (111) surface.

As a result, the ratio of the first thickness T1 to the second thickness T2 may be greater than 2, and the total loss of the S/D structure 160a may be increased during the subsequent etching process.

In some embodiments, during the formation of the capping layer 170, a B-containing precursor is introduced or supplied into the reaction chamber so that the capping layer 170 has a third dopant concentration of B. In some embodiments, the third dopant concentration of B is lower than the first dopant concentration of B and the second dopant concentration of B. In some embodiments, the third dopant concentration of B is in a range of about $1 \times 10^{19}/cm^3$ to about $8 \times 10^{20}/cm^3$.

In some cases, the third dopant concentration of B should not be greater than the second dopant concentration of B. In some embodiments, the capping layer 170 is used as a buffer layer to separate the second epitaxial layer 174 from the subsequently formed dielectric layer. As a result, it prevents leakage due to the large difference of the dopant concentration in the interface between the S/D structure 160a and the dielectric layer.

In some embodiments, during the formation of the capping layer 170, HCl gas is introduced or supplied into the reaction chamber, and the flow rate of the HCl gas is in a range of about 10 sccm to about 1000 sccm. In some embodiments, during the formation of the capping layer 170, the flow rate of the HCl gas is in a range of about 20 sccm to about 100 sccm.

In some cases, the flow rate of the HCl gas should not be greater than 1000 sccm. If the flow rate of the HCl gas is greater than 1000 sccm, the growth rate of the capping layer 170 on (100) surface may be faster than the growth rate on (111) surface. As a result, the ratio of the first thickness T1 to the second thickness T2 may be greater than 2, and the total loss of the S/D structure 160a may be increased during a subsequent etching process.

In some embodiments, during the epitaxial growth of the capping layer 170, the temperature in the reaction chamber is in a range of about 400° C. to about 800° C. In some embodiments, the pressure in the reaction chamber is in a range of about 1 torr to about 600 torr.

Many variations and/or modifications can be made to embodiments of the disclosure. In some embodiments, the capping layer 170 contains an insulating material including group-IV element, a group-V element, and/or a group-VI element. In some embodiments, the capping layer 170 is made of silicon nitride, silicon oxynitride, silicon carbide, silicon oxycarbide (SiOC) or a combination thereof. In some embodiments, the ratio of the first thickness T1 to the second thickness T2 is in a range about 1 to about 2.

Figure 2G:
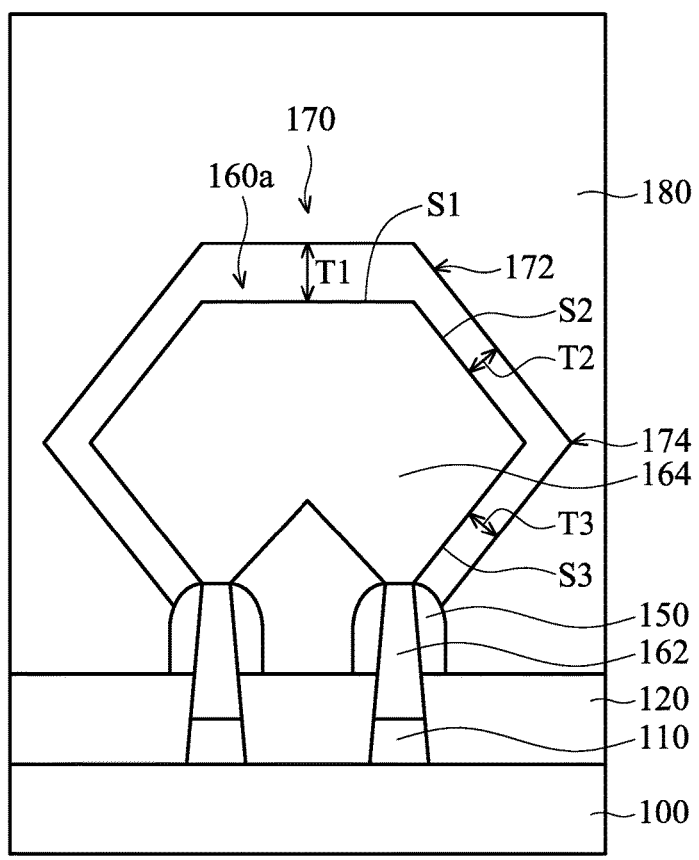

As shown in FIG. 2G, a dielectric layer 180 is deposited over the capping layer 170 after the capping layer 170 is formed, in accordance with some embodiments. The dielectric layer 180 surrounds and covers the capping layer 170 and the S/D structure 160a.

In some embodiments, the dielectric layer 180 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The material of the dielectric layer 180 is selected to minimize propagation delays and crosstalk between nearby conductive features. In some embodiments, the dielectric layer 180 is deposited using a flowable CVD process, a spin-on process, an ALD process, a PVD process, another applicable process, or a combination thereof.

Figure 2H:
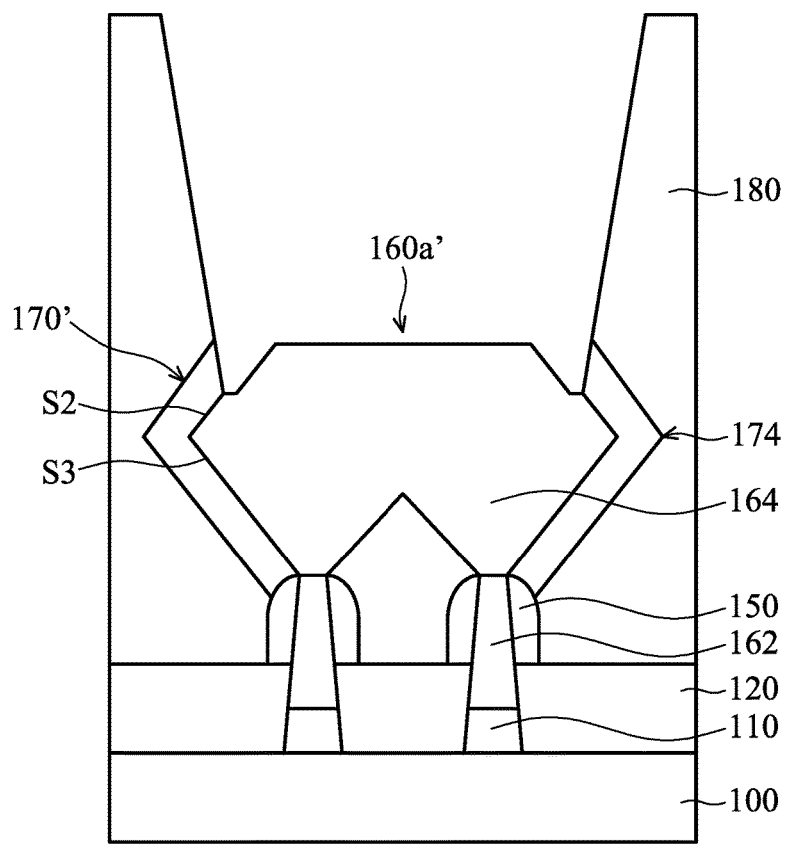

As shown in FIG. 2H, after the dielectric layer 180 is deposited, an etching process is performed to form a trench (or openings) in the dielectric layer 180, in accordance with some embodiments. In some embodiments, the dielectric layer 180, a portion of the capping layer 170 and the S/D structure 160a are etched during the etching process, as shown in FIG. 2H. More specifically, the top portion 172 of the capping layer 170 is removed completely. A portion of the lower portion 174 over the second surface S2 is etched, and the other portion of the lower portion 174 remains on the second surface S2 and the third surface S3 after the etching process. In some embodiments, the remaining S/D structure 160a' is exposed by the dielectric layer 180 and the remaining capping layer 170'. In some embodiments, the capping layer 170' is covered by the dielectric layer 180, and a surface of the capping layer 170' is exposed as shown in FIG. 2H.

In some embodiments, the etching process includes a dry etching process. In some embodiments, the dry etching process includes a plasma etching process or another applicable etching process. In some embodiments, the etchant used in the etching process contains carbon, chlorine and fluorine. For example, the etchant used in the etching process may include chlorine ($Cl_2$), tetrafluoromethane ($CF_4$), fluoromethane ($CH_3F$), hexa-fluoro-butadiene ($C_4F_6$), or another suitable etching gas.

In some embodiments, since the ratio of the first thickness T1 to the second thickness T2 is smaller than 2, the difference of the loss of the S/D structure 160a on the first surface S1 and on the second surface S2 is small after the etching process. In addition, the loss of the S/D structure 160a on the first surface S1 and on the second surface S2 is very small. Therefore, the profile of the remaining S/D structure 160a' is similar to that of the S/D structure 160a. Moreover, since the loss of the S/D structure 160a is decreased, the performance of the semiconductor device structure is improved.

Figure 2I:
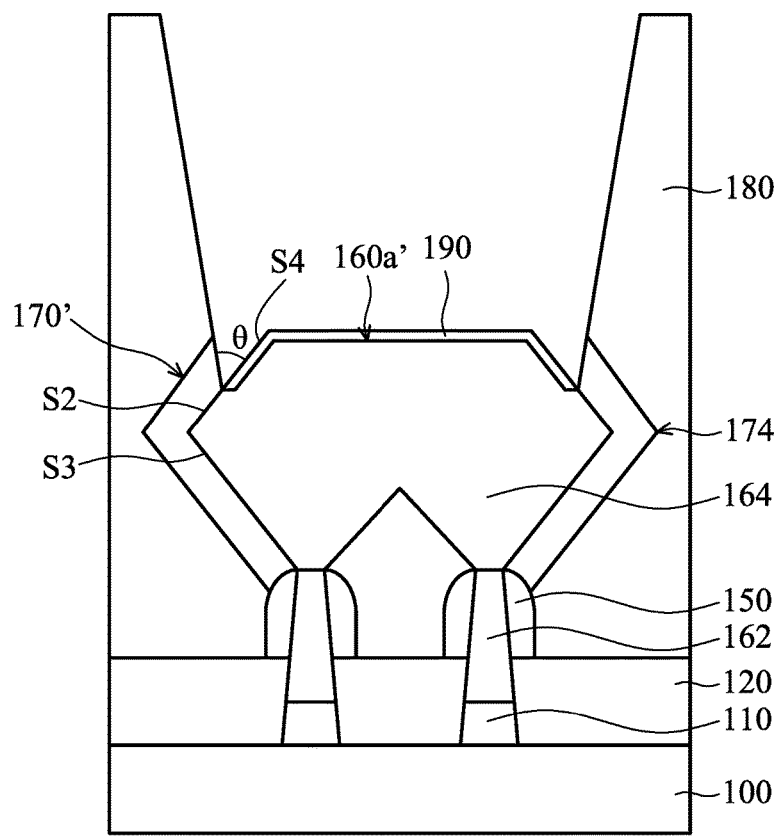

As shown in FIG. 2I, after the etching process is performed, a silicide layer 190 is formed over the S/D structures 160a' in accordance with some embodiments. In some embodiments, the surface of the S/D structure 160a' exposed by the dielectric layer 180 is covered by the silicide layer 190, as shown in FIG. 2I. In some embodiments, the silicide layer 190 has a fourth surface S4 which is substantially level with the second surface S2 of the S/D structure 160a', as shown in FIG. 2I. In some embodiments, an angle θ constituted by the capping layer 170' and the silicide layer 190 is in a range of about 30° to about 75°, as shown in FIG. 2I.

In some embodiments, a metal layer is deposited over the S/D structure 160a', and an anneal process is performed to form the silicide layer 190. In some embodiments, the metal layer is made of or includes titanium, cobalt, tungsten, nickel or a combination thereof. In some embodiments, the metal layer is deposited using a PVD process such as a sputtering process, a CVD process, a spin-on process, another applicable process, or a combination thereof.

Since the loss of the S/D structure 160a in the previous etching process is small, the formation of the silicide layer 190 may compensate the loss of the S/D structure 160a. As a result, the performance of the semiconductor device structure is improved. In some embodiments, due to the small difference between the loss of the S/D structure 160a on the first surface S1 and on the second surface S2, the angle θ constituted by the capping layer 170' and the silicide layer 190 is not greater than 75°, as shown in FIG. 2I.

Figure 2J:
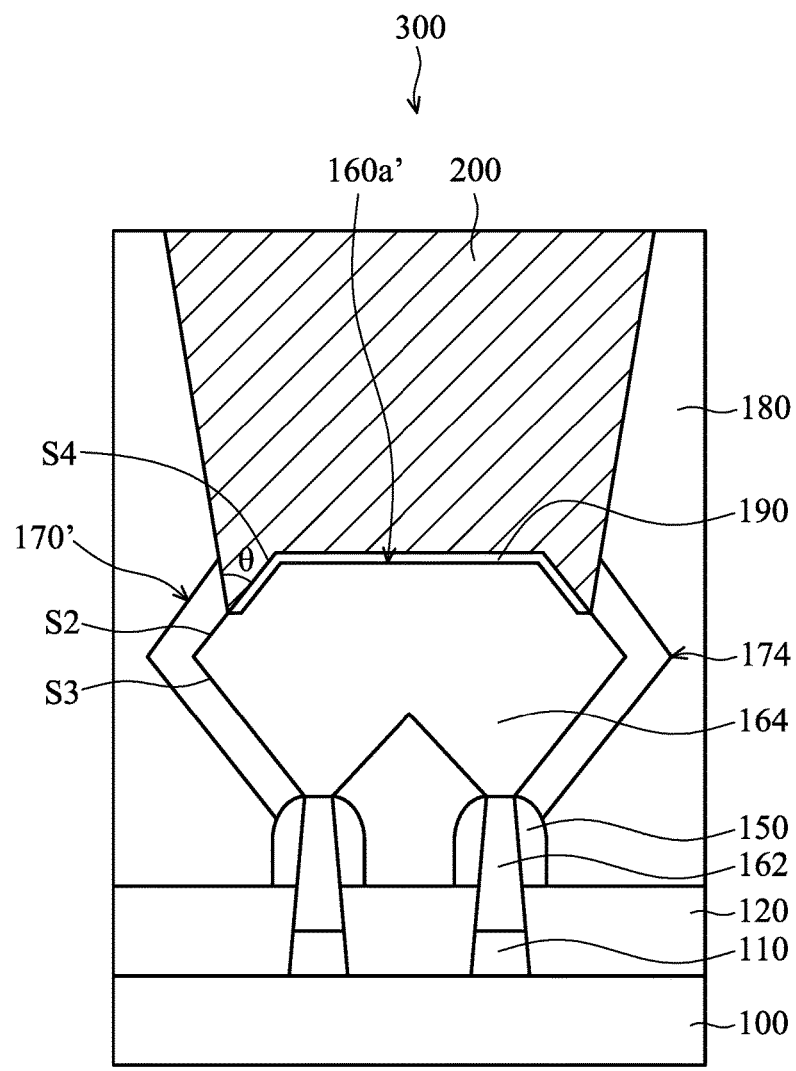

As shown in FIG. 2J, after the silicide layer 190 is formed, a conductive material (not shown) is filled into the trench to form a contact 200, and a semiconductor device structure 300 is created, in accordance with some embodiments. As shown in FIG. 2J, the contact 200 is electrically connected to the S/D structure 160a' through the silicide layer 190.

In some embodiments, a conductive material layer is deposited over the dielectric layer 180 to fill the trench. A planarization process is subsequently used to remove portions of the conductive material layer outside of the trench. As a result, the remaining portions of the conductive material layer in the trench form the contact 200. In some embodiments, the contact 200 adjoins the silicide layer 190.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

Figure 3:
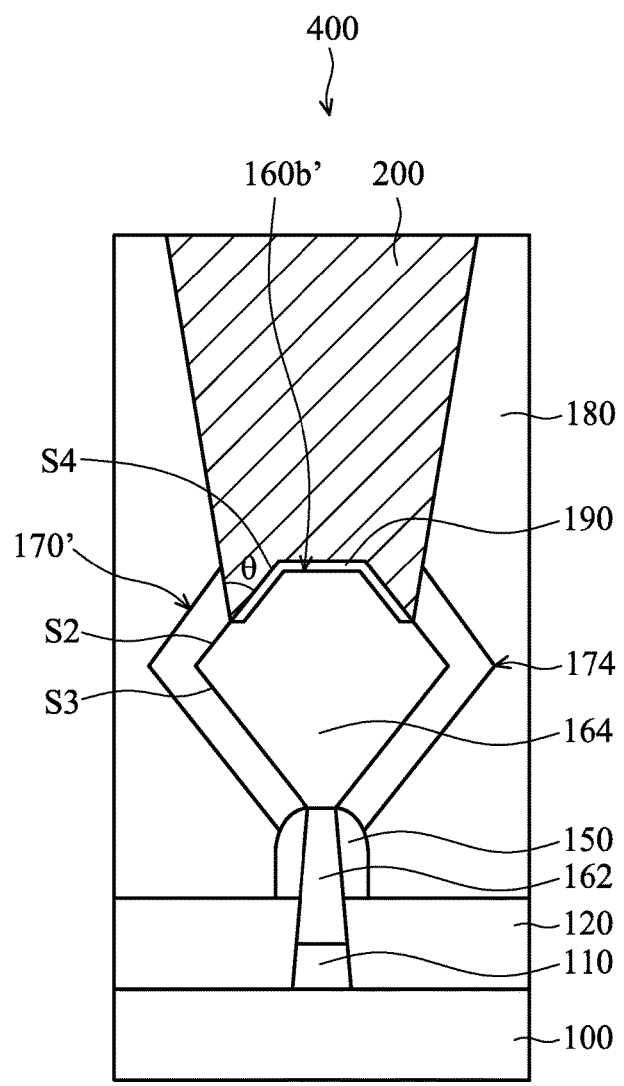
FIG. 3 is a cross-sectional representation of a semiconductor device structure, in accordance with some embodiments.

FIG. 3 is a cross-sectional representation of a semiconductor device structure 400, in accordance with some embodiments. The semiconductor device structure 400 may be similar to, or the same as, the semiconductor device structure 300 described above, except that one of the S/D structures 160b' is formed over one fin structure 110, in accordance with some embodiments. In some embodiments, the capping layer 170' is in direct contact with two fin spacers 150 on two opposite sidewalls of the same first epitaxial layer 162, as shown in FIG. 3.

Figure 4:
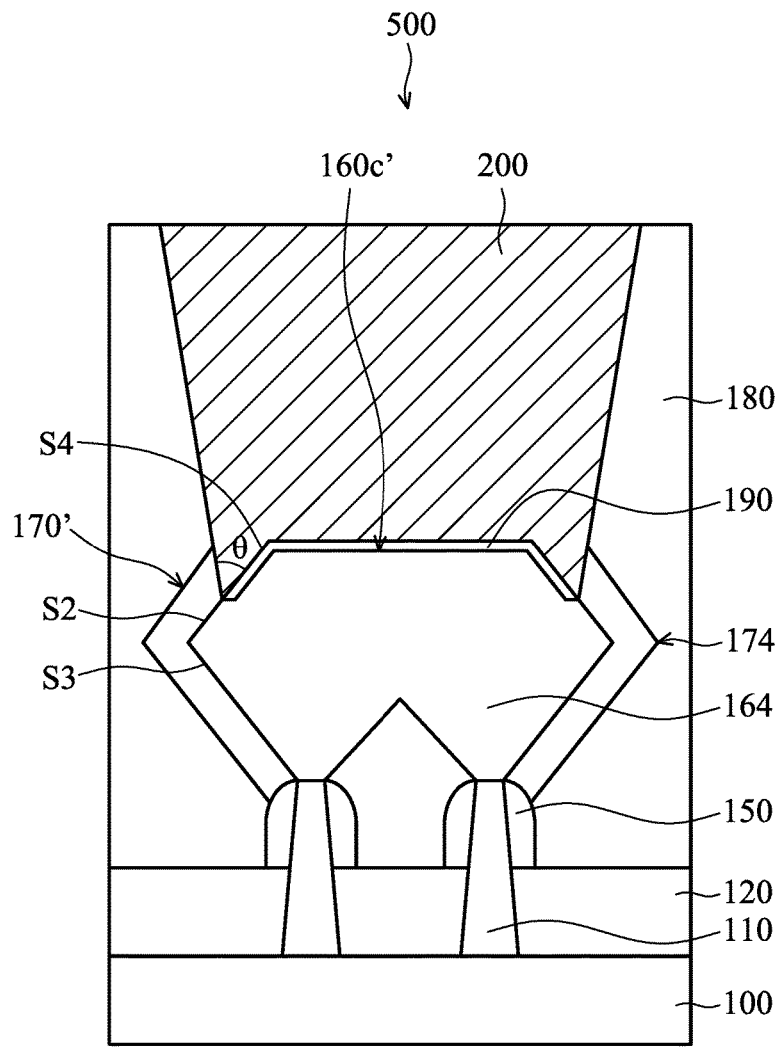
FIG. 4 is a cross-sectional representation of a semiconductor device structure, in accordance with some embodiments.

FIG. 4 is a cross-sectional representation of a semiconductor device structure 500, in accordance with some embodiments. The semiconductor device structure 500 may be similar to, or the same as, the semiconductor device structure 300 described above, except that the fin structures 110 are not etched, and the first epitaxial layer 162 is not formed, in accordance with some embodiments. In some embodiments, the S/D structure 160c' is in direct contact with the fin structures 110, as shown in FIG. 4. In some embodiments, a portion of the capping layer 170' is under the top surfaces of the fin structures 110.

Figure 5:
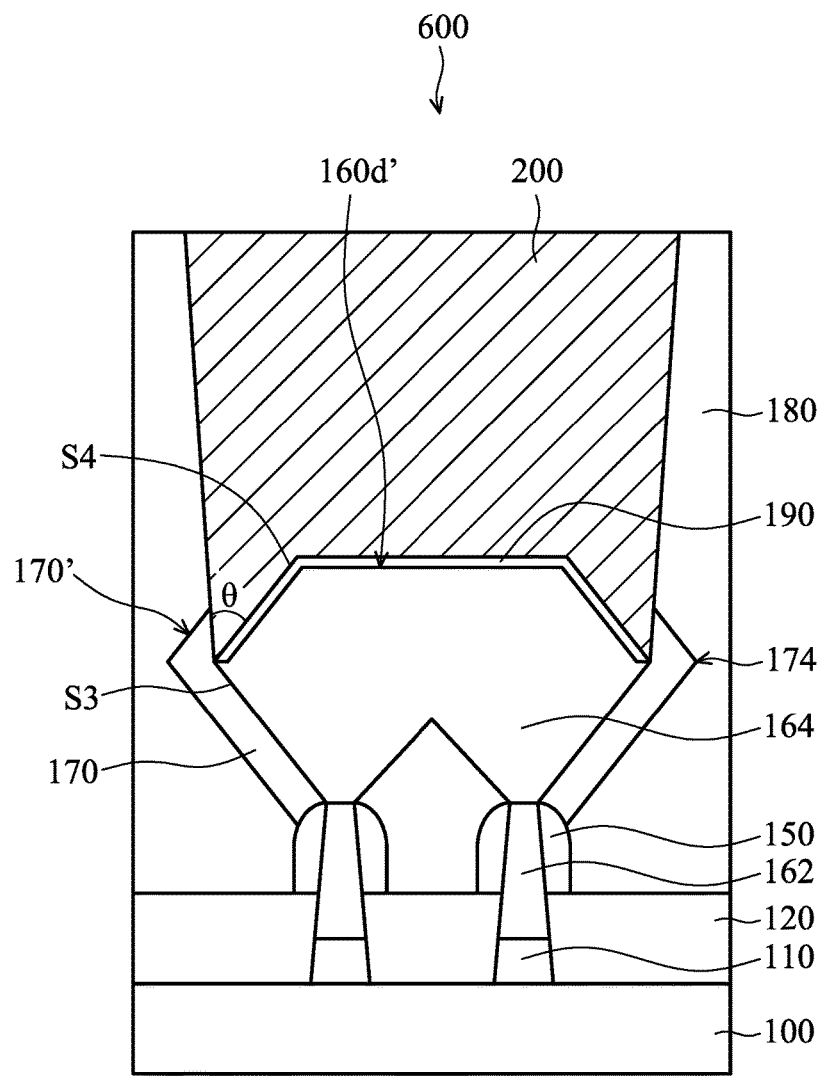
FIG. 5 is a cross-sectional representation of a semiconductor device structure, in accordance with some embodiments.

FIG. 5 is a cross-sectional representation of a semiconductor device structure 600, in accordance with some embodiments. The semiconductor device structure 600 may be similar to, or the same as, the semiconductor device structure 300 described above, except that the capping layer 170' over the second surface S2 of the S/D structure 160 is completely removed, in accordance with some embodiments. In some embodiments, the silicide layer 190 is adjacent to the third surface S3 of the S/D structure 160d', as shown in FIG. 5. Since the interface area between the silicide layer 190 and the contact 200 is increased, the performance of the semiconductor device structure 600 is improved.

In accordance with some embodiments, methods for forming semiconductor device are provided. The methods include forming a capping layer over an S/D structure. The capping layer has a top portion and a lower portion, and the ratio of the thickness of the top portion to that of the lower portion is smaller than 2. Due to the small difference between the thickness of the top portion and that of the lower portion, the loss of the S/D structure on the side surface is substantially equal to that on the top surface after the subsequent etching process. As a result, the loss of the S/D structure is decreased, and the performance of the semiconductor device structures is improved.

Embodiments of the disclosure can be applied to not only a semiconductor device structure with N-type or P-type transistors but also a semiconductor device structure with complementary transistors or other suitable devices. Embodiments of the disclosure are not limited and may be applied to fabrication processes for any suitable technology generation. Various technology generations include a 16 nm node, a 10 nm node, a 7 nm node, or another suitable node.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with some embodiments, a method for fabricating a semiconductor device structure is provided. The method includes forming a fin structure over a substrate. The method also includes forming a gate structure over the fin structure. The method further includes epitaxially growing a source/drain structure covering the fin structure. In addition, the method includes epitaxially growing a capping layer over the source/drain structure. The capping layer has a top portion and a lower portion under the top portion. The top portion has a first thickness and the lower portion has a second. A ratio of the first thickness to the second thickness is in a range of about 1.01 to about 2. The method also includes etching the top portion and the lower portion of the capping layer. The method further includes forming a silicide layer over the source/drain structure and a contact over the silicide layer.

In accordance with some embodiments, a method for fabricating a semiconductor device structure is provided. The method includes forming a fin structure over a substrate and a gate structure over the fin structure. The method also includes epitaxially growing a first portion of a source/drain structure over the fin structure. The first portion of the source/drain structure has a first atomic percentage of Ge. In addition, the method includes epitaxially growing a capping layer covering the first portion of the source/drain structure, wherein the capping layer has a second atomic percentage of Ge smaller than the first atomic percentage of Ge. The method also includes etching the capping layer to expose the source/drain structure. The method further includes forming a silicide layer over the source/drain structure and a contact over the silicide layer.

In accordance with some embodiments, a method for fabricating a semiconductor device structure is provided. The method includes forming a fin structure over a substrate and a gate structure over the fin structure. The method also includes epitaxially growing a source/drain structure over the fin structure. The method further includes epitaxially growing a capping layer covering the source/drain structure. Epitaxially growing the capping layer includes introducing a Ge-containing precursor so that the capping layer has an atomic percentage of Ge which is in a range of about 1% to about 35%. Epitaxially growing the capping layer includes introducing HCl gas. In addition, the method includes etching a top portion and a lower portion under the top portion of the capping layer to expose the source/drain structure. The method also includes forming a silicide layer over the source/drain structure. The method further includes forming a contact over the silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device structure, comprising:
    forming a fin structure over a substrate;
    forming a gate structure over the fin structure;
    epitaxially growing a source/drain structure covering the fin structure, wherein the source/drain structure has a (100) surface and a (111) surface;
    epitaxially growing a capping layer over the source/drain structure, wherein the capping layer has a top portion epitaxially grown from the (100) surface of the source/drain structure and a lower portion under the top portion and epitaxially grown from the (111) surface of the source/drain structure, the top portion has a first thickness and the lower portion has a second thickness, and a ratio of the first thickness to the second thickness is in a range of about 1.01 to about 2;
    etching the top portion and the lower portion of the capping layer to expose the source/drain structure;
    forming a silicide layer over the source/drain structure; and
    forming a contact over the silicide layer.

2. The method as claimed in claim 1, wherein epitaxially growing the source/drain structure comprises:
    introducing a Ge-containing precursor so that the source/drain structure has a first atomic percentage of Ge; and
    introducing a B-containing precursor so that the source/drain structure has a first dopant concentration of B, and wherein epitaxially growing the capping layer comprises:
    introducing a Ge-containing precursor so that the capping layer has a second atomic percentage of Ge which is smaller than the first atomic percentage; and
    introducing a B-containing precursor so that the capping layer has a second dopant concentration of B which is lower than the first dopant concentration.

3. The method as claimed in claim 2, wherein the second atomic percentage of Ge is in a range of about 1% to about 35%.

4. The method as claimed in claim 2, wherein the second dopant concentration of B is in a range of about $1\times10^{19}/cm^3$ to about $8\times10^{20}/cm^3$.

5. The method as claimed in claim 2, wherein epitaxially growing the capping layer further comprises:
    introducing HCl gas, wherein a flow rate of the HCl gas is in a range of about 10 sccm to about 1000 sccm.

6. The method as claimed in claim 1, wherein the silicide layer has a surface which is substantially level with a surface of the lower portion of the capping layer.

7. The method as claimed in claim 1, wherein etching the capping layer comprises performing a dry etching process, and performing the dry etching process comprises:
    introducing a reactant gas, wherein the reactant gas comprises $Cl_2$, $CF_4$, $C_4F_6$ or $CH_3F$.

8. A method for fabricating a semiconductor device structure, comprising:
    forming a fin structure over a substrate;
    forming a gate structure over the fin structure;
    epitaxially growing a first portion of a source/drain structure over the fin structure, wherein the first portion of the source/drain structure has a first atomic percentage of Ge;
    epitaxially growing a capping layer covering the first portion of the source/drain structure, wherein the capping layer has a second atomic percentage of Ge that is smaller than the first atomic percentage of Ge;

etching the capping layer to expose the source/drain structure;

forming a silicide layer over the source/drain structure; and forming a contact over the silicide layer.

9. The method as claimed in claim 8, further comprising:

epitaxially growing a second portion of a source/drain structure between the first portion of the source/drain structure and the fin structure, wherein the second portion of the source/drain structure has a third atomic percentage of Ge that is smaller than the first atomic percentage of Ge.

10. The method as claimed in claim 9, wherein the first atomic percentage of Ge is in a range of about 20% to about 80%, the second atomic percentage of Ge is in a range of about 1% to about 35%, and the third atomic percentage of Ge is in a range of about 10% to about 40%.

11. The method as claimed in claim 9, wherein epitaxially growing the second portion of the source/drain structure comprises:

forming fin spacers over sidewalls of the fin structure;

recessing the fin structure to form a recess between the fin spacers and over the fin structure; and epitaxially growing the second portion of the source/drain structure in the recess.

12. The method as claimed in claim 8, wherein epitaxially growing the capping layer comprises:

introducing a B-containing precursor so that the capping layer has a dopant concentration of B which is in a range of about $1\times10^{19}/cm^3$ to about $8\times10^{20}/cm^3$.

13. The method as claimed in claim 8, wherein epitaxially growing the capping layer comprises:

introducing HCl gas, wherein the flow rate of the HCl gas is in a range of about 10 sccm to about 1000 sccm.

14. The method as claimed in claim 8, wherein epitaxially growing the capping layer comprises:

epitaxially growing a top portion of the capping layer from a (100) surface of the source/drain structure and epitaxially growing a lower portion of the capping layer under the top portion of the capping layer from a (111) surface of the source/drain structure wherein etching the capping layer comprises:

etching the top portion and the lower portion of the capping layer, wherein the top portion is removed completely, and the first portion of the source/drain structure is exposed by the lower portion of the capping layer, and wherein a ratio of a thickness of the top portion to a thickness of the lower portion is in a range of about 1.01 to about 2 before etching the capping layer.

15. The method as claimed in claim 8, wherein an angle between the silicide layer and the capping layer is in a range of about 30° to about 75°.

16. A method for fabricating a semiconductor device structure, comprising:

forming a fin structure over a substrate;

forming a gate structure over the fin structure;

epitaxially growing a source/drain structure over the fin structure;

epitaxially growing a top portion of a capping layer from a (100) surface of the source/drain structure and epitaxially growing a lower portion of the capping layer that is under the top portion of the capping layer from a (111) surface of the source/drain structure, wherein the top portion has a first thickness and the lower portion has a second thickness, and the first thickness is larger than the second thickness, and wherein epitaxially growing the capping layer comprises:

introducing a Ge-containing precursor so that the capping layer has an atomic percentage of Ge which is in a range of about 1% to about 35%; and introducing HCl gas;

etching the top portion and the lower portion under the top portion of the capping layer to expose the source/drain structure;

forming a silicide layer over the source/drain structure; and forming a contact over the silicide layer.

17. The method as claimed in claim 16, wherein a ratio of the first thickness of the top portion to the second thickness of the lower portion is in a range of about 1.01 to about 2 before etching the capping layer.

18. The method as claimed in claim 17, wherein the first thickness is in a range of about 1 nm to about 10 nm, and the second thickness is in a range of about 0.5 nm to about 9.5 nm.

19. The method as claimed in claim 16, wherein epitaxially growing the capping layer comprises:

introducing a B-containing precursor so that the capping layer has a dopant concentration of B which is in a range of about $1\times10^{19}/cm^3$ to $8\times10^{20}/cm^3$.

20. The method as claimed in claim 16, wherein the flow rate of the HCl gas is in a range of about 10 sccm about 1000 sccm.

* * * * *